United States Patent
Kwak et al.

(10) Patent No.: US 12,202,997 B2
(45) Date of Patent: *Jan. 21, 2025

(54) ENCAPSULATING COMPOSITION

(71) Applicant: LG CHEM, LTD., Seoul (KR)

(72) Inventors: Ji Won Kwak, Daejeon (KR); Kook Hyun Choi, Daejeon (KR); Mi Lim Yu, Daejeon (KR); Dong Hwan Kim, Daejeon (KR); Hae Jong Jung, Daejeon (KR)

(73) Assignee: LG Chem, Ltd., Seoul (KR)

( * ) Notice: Subject to any disclaimer, the term of this patent is extended or adjusted under 35 U.S.C. 154(b) by 875 days.

This patent is subject to a terminal disclaimer.

(21) Appl. No.: 15/734,510

(22) PCT Filed: Jun. 12, 2019

(86) PCT No.: PCT/KR2019/007072
§ 371 (c)(1),
(2) Date: Dec. 2, 2020

(87) PCT Pub. No.: WO2019/240484
PCT Pub. Date: Dec. 19, 2019

(65) Prior Publication Data
US 2021/0230445 A1    Jul. 29, 2021

(30) Foreign Application Priority Data

Jun. 12, 2018    (KR) .................. 10-2018-0067307

(51) Int. Cl.
*C09D 171/02*    (2006.01)
*C08G 59/24*    (2006.01)
(Continued)

(52) U.S. Cl.
CPC ........... *C09D 171/02* (2013.01); *C08G 59/24* (2013.01); *C08G 59/4064* (2013.01);
(Continued)

(58) Field of Classification Search
None
See application file for complete search history.

(56) References Cited

U.S. PATENT DOCUMENTS 10,351,736 B2    7/2019    Kim et al.
10,720,600 B2    7/2020    Moon et al.
(Continued)

FOREIGN PATENT DOCUMENTS

CN    001320146 A    10/2001
CN    101155853 A    4/2008
(Continued)

OTHER PUBLICATIONS

International Search Report from PCT/KR2019/007072, dated Sep. 17, 2019.
(Continued)

*Primary Examiner* — Eli D. Strah
(74) *Attorney, Agent, or Firm* — Bryan Cave Leighton Paisner LLP

(57) ABSTRACT

An encapsulating composition and an organic electronic device comprising the same, and the encapsulating composition which is capable of effectively blocking moisture or oxygen penetrating into the organic electronic device from the outside to secure the lifetime of the organic electronic device, implementing a top-emitting organic electronic device, being applied in an inkjet method, and providing a thin display.

18 Claims, 1 Drawing Sheet

(51) Int. Cl.
  *C08G 59/40* (2006.01)
  *C08G 65/18* (2006.01)
  *C08K 5/1525* (2006.01)
  *C09D 11/102* (2014.01)
  *C09D 11/38* (2014.01)
  *C09D 163/00* (2006.01)
  *H01L 51/00* (2006.01)
  *H01L 51/10* (2006.01)
  *H01L 51/44* (2006.01)
  *H01L 51/52* (2006.01)
  *H10K 10/88* (2023.01)
  *H10K 30/88* (2023.01)
  *H10K 50/844* (2023.01)
  *H10K 85/10* (2023.01)

(52) U.S. Cl.
  CPC ............ *C08G 65/18* (2013.01); *C08K 5/1525* (2013.01); *C09D 11/102* (2013.01); *C09D 11/38* (2013.01); *C09D 163/00* (2013.01); *H10K 10/88* (2023.02); *H10K 30/88* (2023.02); *H10K 50/844* (2023.02); *H10K 85/111* (2023.02); *H10K 85/151* (2023.02)

(56) References Cited

U.S. PATENT DOCUMENTS

| | | | |
|---|---|---|---|
| 11,041,089 B2* | 6/2021 | Woo | C09D 11/101 |
| 11,171,309 B2* | 11/2021 | Woo | H10K 50/8426 |
| 11,773,253 B2* | 10/2023 | Woo | H10K 59/00 523/403 |
| 2008/0296159 A1* | 12/2008 | Kong | C08G 65/18 204/600 |
| 2017/0166715 A1* | 6/2017 | Choi | B32B 15/082 |
| 2017/0190588 A1* | 7/2017 | Ueno | B01J 20/3021 |
| 2017/0198157 A1* | 7/2017 | Park | C09D 11/102 |
| 2018/0118984 A1 | 5/2018 | Lee et al. | |
| 2019/0225740 A1* | 7/2019 | Kim | C08G 59/40 |
| 2020/0052215 A1 | 2/2020 | Zhou | |

FOREIGN PATENT DOCUMENTS

| | | |
|---|---|---|
| CN | 101891945 A | 11/2010 |
| CN | 105873974 A | 8/2016 |
| CN | 107580619 A | 1/2018 |
| EP | 19992654 A1 | 11/2008 |
| JP | 2003-327951 A | 11/2003 |
| JP | 2008-535975 A | 9/2008 |
| JP | 2012-116975 A | 6/2012 |
| JP | 2016-536410 A | 11/2016 |
| JP | 2017-512360 A | 5/2017 |
| JP | 2017-228414 A | 12/2017 |
| JP | 2018-035342 A | 3/2018 |
| JP | 2018-513887 A | 5/2018 |
| JP | 2018-513889 A | 5/2018 |
| KR | 10-2007-0122526 A | 12/2007 |
| KR | 10-2016-0037123 A | 4/2016 |
| KR | 10-2016-0048795 A | 5/2016 |
| KR | 10-2016-0065778 A | 6/2016 |
| KR | 10-2016-0114539 A | 10/2016 |
| KR | 10-2016-0114541 A | 10/2016 |
| KR | 10-2018-0036619 A | 4/2018 |
| KR | 10-2018-0066881 A | 6/2018 |
| KR | 10-2018-0128863 A | 12/2018 |
| TW | 201730230 A | 9/2017 |
| WO | 2006-107803 A2 | 10/2006 |
| WO | 2011-040211 A1 | 4/2011 |
| WO | 2014-083850 A1 | 6/2014 |
| WO | 2015-064410 A1 | 5/2015 |
| WO | WO-2018062930 A2 * | 4/2018 ............ C08G 59/223 |
| WO | 2018217026 A1 | 11/2018 |

OTHER PUBLICATIONS

Written Opinion of the ISA from PCT/KR2019/007072, dated Sep. 17, 2019.

* cited by examiner

[Figure 1]
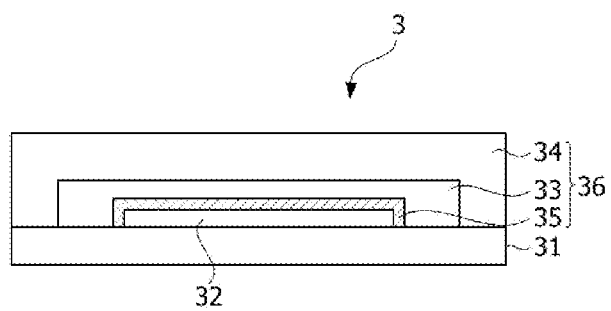
[Figure 2]
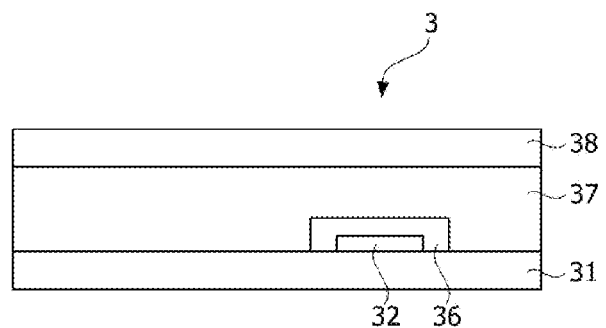

ENCAPSULATING COMPOSITION

CROSS-REFERENCE TO RELATED APPLICATIONS

This application is a National Stage Application of International Application No. PCT/KR2019/007072 filed on Jun. 12, 2019, which claims the benefit of priority based on Korean Patent Application No. 10-2018-0067307 filed on Jun. 12, 2018, the disclosure of which is incorporated herein by reference in its entirety.

TECHNICAL FIELD

The present application relates to an encapsulating composition, an organic electronic device comprising the same, and a method for manufacturing the organic electronic device.

BACKGROUND

An organic electronic device (OED) is a device comprising a layer of an organic material that generates an alternating current of electric charges using holes and electrons, and an example thereof may include a photovoltaic device, a rectifier, a transmitter and an organic light emitting diode (OLED), and the like.

The organic light emitting diode (OLED) among the organic electronic devices has lower power consumption and faster response speed, than conventional light sources, and is advantageous for reducing thickness of display devices or lighting devices. In addition, the OLED has excellent space utilization, so that it is expected to be applied in various fields covering various portable devices, monitors, notebooks, and televisions.

In commercialization and expanded application of OLEDs, the most important problem is a durability. Organic materials and metal electrodes, and the like, contained in OLEDs are very easily oxidized by external factors such as moisture. Thus, products comprising OLEDs are highly sensitive to environmental factors. Accordingly, various methods have been proposed to effectively block penetration of oxygen or moisture from the outside into organic electronic devices such as OLEDs.

Technical Problem

The present application provides an encapsulating composition which can effectively block moisture or oxygen penetrating into an organic electronic device from the outside to secure the lifetime of the organic electronic device, can implement a top-emitting organic electronic device, can be applied in an inkjet method and can provide a thin display, and an organic electronic device comprising the same.

Technical Solution

The present application relates to an encapsulating composition. The encapsulating composition may be a sealing material applied to sealing or encapsulating an organic electronic device such as, for example, an OLED. In one example, the encapsulating composition of the present application can be applied to sealing or encapsulating the entire surface of an organic electronic element. Thus, after the encapsulating composition is applied to the encapsulation, it may be present in an organic layer form sealing the entire surface of the organic electronic element. In addition, the organic layer may be laminated on the organic electronic element together with a protective layer and/or an inorganic layer, which is described below, to form a sealing structure.

In an embodiment of the present application, the present application relates to an encapsulating composition for sealing an organic electronic element applicable to an inkjet process, where the composition may be designed to have appropriate physical properties, when it has been discharged onto a substrate by using inkjet printing capable of non-contact type patterning.

In this specification, the term "organic electronic device" means an article or device having a structure comprising an organic material layer that generates an alternating current of electric charges using holes and electrons between a pair of electrodes facing each other, and an example thereof may include a photovoltaic device, a rectifier, a transmitter and an organic light emitting diode (OLED), and the like, but is not limited thereto. In one example of the present application, the organic electronic device may be an OLED.

An exemplary encapsulating composition may comprise an epoxy compound, a compound having an oxetane group and a moisture adsorbent. The epoxy compound may be a photocurable or thermosetting compound. The compound having an oxetane group may be contained in an amount of 45 parts by weight to 145 parts by weight, 48 parts by weight to 144 parts by weight, 63 parts by weight to 143 parts by weight or 68 parts by weight to 142 parts by weight relative to 100 parts by weight of the epoxy compound. In this specification, In this specification, the term "part by weight" may mean a weight ratio between the respective components. By controlling the content ratio of the composition, the present application can form an organic layer on an organic electronic element by an ink-jet method and provide an organic layer that the applied encapsulating composition has excellent spreadability in a short time and has excellent hardening strength after curing.

The encapsulating composition of the present application may comprise a moisture adsorbent. The term "moisture adsorbent" can be used to generically mean a component capable of adsorbing or removing moisture or humidity penetrating from the outside through a physical or chemical reaction or the like. That is, it means a chemically reactive adsorbent or a physical adsorbent, and a mixture thereof is also usable.

A specific kind of the usable moisture adsorbent in the present application is not particularly limited, which may include, for example, one or a mixture of two or more of a metal oxide, a metal salt or phosphorus pentoxide ($P_2O_5$), and the like, in the case of a chemically reactive adsorbent, and may include zeolite, zirconia or montmorillonite, and the like, in the case of the physical adsorbent.

The encapsulating composition of the present application may comprise a moisture adsorbent in an amount of 5 parts by weight to 150 parts by weight, 5 to 110 parts by weight, 5 parts by weight to 90 parts by weight, 10 to 50 parts by weight, 12 to 38 parts by weight, or 14 to 23 parts by weight, relative to 100 parts by weight of the epoxy compound. As the encapsulating composition of the present application preferably controls the content of the moisture adsorbent to 5 parts by weight or more, the present application can make the encapsulating composition or the cured product thereof exhibit excellent moisture and humidity barrier properties. In addition, by controlling the content of the moisture adsorbent to 150 parts by weight or less, the present application can provide a thin film sealing structure while having physical properties capable of ink-jetting.

In addition, the moisture adsorbent may be controlled to have an average particle diameter of 10 to 15000 nm, 30 nm to 10000 nm, 50 nm to 8000 nm, 80 nm to 5 µm, 90 nm to 3 µm, 95 nm to 980 nm or 98 nm to 495 nm. In this specification, the particle diameter may be measured by a known method with a D50 particle size analyzer. The moisture adsorbent having the size in the above range can appropriately control a reaction rate with moisture to effectively block the moisture invading from the outside, and also in ink-jetting, excellent processability can be implemented by preventing aggregation of the adsorbent.

The encapsulating composition of the present application may be an ink composition applied to the inkjet process, as described above. However, in the inkjet process, the control of the viscosity of the ink composition and thereby the implementation of the composition having physical properties capable of ink-jetting may correspond to very fine work. However, the above-described moisture adsorbent is included in the composition in the form of particles, and thus, for example, the adsorbent is agglomerated in the composition or has poor dispersibility, thereby causing a problem that in the ink-jetting process, the nozzle is clogged or uniform ink-jetting is impossible. However, the present application provides an encapsulating composition of the above-described specific composition formulation, so that the ink-jetting process may be possible smoothly even if the moisture adsorbent is included.

In one example, the encapsulating composition of the present application may have a contact angle to glass of 15° or less, 12° or less, 10° or less, or 8° or less. The lower limit is not particularly limited, but may be 1° or 3° or more. By adjusting the contact angle to 15° or less, the present application can ensure spreadability in a short time in the inkjet coating, thereby forming an organic layer of a thin film. In the present application, the contact angle may be measured by applying a drop of the encapsulating composition onto glass using a sessile drop measurement method, which may be an average value measured after applying 5 times.

In one example, the epoxy compound may be at least monofunctional or bifunctional or more. That is, one or two or more epoxy functional groups may be present in the compound, where the upper limit is not particularly limited, but may be 10 or less. The epoxy compound realizes excellent heat resistance durability at high temperature and high humidity by realizing an appropriate degree of cross-linking to the ink composition.

In an embodiment of the present application, the epoxy compound may comprise a compound having a cyclic structure in its molecular structure and/or a linear or branched aliphatic compound. That is, the encapsulating composition of the present application may comprise at least one of a compound having a cyclic structure in its molecular structure and a linear or branched aliphatic compound as an epoxy compound, and may comprise them together. In one example, the compound having a cyclic structure in its molecular structure may have ring constituent atoms in the molecular structure in a range of 3 to 10, 4 to 8, or 5 to 7, and one or more, or two or more, or 10 or less of the cyclic structures may be present in the compound. When the compound having a cyclic structure and the linear or branched aliphatic compound are included together, the linear or branched aliphatic compound may be included in the encapsulating composition in an amount of 20 parts by weight or more, less than 205 parts by weight, or 23 parts by weight to 204 parts by weight, 30 parts by weight to 203 parts by weight, 34 parts by weight to 202 parts by weight, 40 parts by weight to 201 parts by weight, 60 parts by weight to 200 parts by weight or 100 parts by weight to 173 parts by weight, relative to 100 parts by weight of the compound having a cyclic structure. By controlling the content range, the present application makes it possible for the encapsulating composition to prevent element damage in sealing the entire surface of an organic electronic element, to have appropriate physical properties capable of ink-jetting, to have excellent curing strength after curing and also to realize excellent moisture barrier properties together.

In one example, the epoxy compound may have an epoxy equivalent in a range of 50 to 350 g/eq, 73 to 332 g/eq, 94 to 318 g/eq, or 123 to 298 g/eq. Also, the compound having an oxetane group and/or the epoxy compound may have a weight average molecular weight in a range of 150 to 1,000 g/mol, 173 to 980 g/mol, 188 to 860 g/mol, 210 to 823 g/mol or 330 to 780 g/mol. By controlling the epoxy equivalent of the epoxy compound to be low or controlling the weight average molecular weight of the compound to be low, the present application can prevent the viscosity of the composition from becoming too high to make the inkjet process impossible, while improving the degree of curing completion after curing of the encapsulating composition and simultaneously provide moisture barrier property and excellent curing sensitivity. In this specification, the weight average molecular weight means a value converted to standard polystyrene measured by GPC (gel permeation chromatograph). In one example, a column made of a metal tube having a length of 250 to 300 mm and an inner diameter of 4.5 to 7.5 mm is filled with 3 to 20 mm polystyrene beads. When a solution diluted by dissolving a substance to be measured in a THF solvent is passed through the column, the weight average molecular weight can be indirectly measured according to a flowing time. It can be detected by plotting amounts separated from the column by size for each time. In this specification, the epoxy equivalent is also grams (g/eq) of the resin containing one gram equivalent of an epoxy group, which may be measured according to the method defined in JIS K 7236.

The compound having an oxetane group may have a boiling point in a range of 90 to 300° C., 98 to 270° C., 110 to 258° C., or 138 to 237° C. By controlling the boiling point of the compound to the above range, the present application can provide a sealing material which can have excellent moisture barrier properties from the outside while realizing excellent printability even at a high temperature in an inkjet process, and prevent damage applied to the element due to suppressed outgas. In this specification, the boiling point may be measured at 1 atm, unless otherwise specified.

In one example, the compound having a cyclic structure in its molecular structure may be exemplified by 3,4-epoxycyclohexylmethyl 3',4'-epoxycyclohexanecarboxylate (EEC) and derivatives, dicyclopentadiene dioxide and derivatives, vinylcyclohexene dioxide and derivatives, or 1,4-cyclohexanedimethanol bis(3,4-epoxycyclohexanecarboxylate) and derivatives, but is not limited thereto.

In one example, as long as the compound comprising an oxetane group has the functional group, the structure is not limited, and for example, OXT-221, CHOX, OX-SC, OXT101, OXT121, or OXT212 from TOAGOSEI, or EHO, OXBP, OXTP or OXMA from ETERNACOLL may be exemplified. Also, the linear or branched aliphatic epoxy compound may include aliphatic glycidyl ether, 1,4-butanediol diglycidyl ether, ethylene glycol diglycidyl ether, 1,6-hexanediol diglycidyl ether, propylene glycol diglycidyl ether, diethylene glycol diglycidyl ether, butyl glycidyl ether, 2-ethylhexyl glycidyl ether or neopentyl glycol diglycidyl ether, but is not limited thereto.

In an embodiment of the present application, the encapsulating composition may further comprise a photoinitiator. The photoinitiator may be an ionic photoinitiator. In addition, the photoinitiator may be a compound absorbing a wavelength in a range of 200 nm to 400 nm. The present application can implement excellent curing properties in the specific composition of the present application by using the photoinitiator.

In one example, the photoinitiator may be a cationic photopolymerization initiator. As the cationic photopolymerization initiator, a known material in the art can be used and for example, it may include a compound having a cation moiety comprising aromatic sulfonium, aromatic iodonium, aromatic diazonium or aromatic ammonium and an anion moiety comprising $AsF_6^-$, $SbF_6^-$, $PF_6^-$, or tetrakis(pentafluorophenyl) borate. Furthermore, as the cationic photopolymerization initiator, an ionized cationic initiator of onium salt or organometallic salt series or a non-ionized cationic photopolymerization initiator of organic silane or latent sulfonic acid series can be exemplified. Diaryliodonium salt, triarylsulfonium salt or aryldiazonium salt and the like can be exemplified as the initiator of the onium salt series, iron arene or the like can be exemplified as the initiator of the organometallic salt series, o-nitrobenzyl triaryl silyl ether, triaryl silyl peroxide or an acyl silane and the like can be exemplified as the initiator of the organosilane series, and α-sulfonyloxy ketone or α-hydroxymethylbenzoin sulfonate and the like can be exemplified as the initiator of the latent sulfuric acid series, without being limited thereto.

In one example, the encapsulating composition of the present application may comprise a photoinitiator including a sulfonium salt, as the photoinitiator of the specific composition as described above, so as to be suitable for use in sealing an organic electronic element in an inkjet manner. Even if the encapsulating composition according to the composition is directly sealed on the organic electronic element, the amount of outgas generated is small, whereby chemical damage to the element can be prevented. In addition, the photoinitiator containing a sulfonium salt also has excellent solubility, whereby it can be suitably applied to an inkjet process.

In an embodiment of the present application, the photoinitiator may be included in an amount of 1 to 15 parts by weight, 3 to 14 parts by weight or 7 to 13.5 parts by weight, relative to 100 parts by weight of the epoxy compound. By adjusting the photoinitiator content range, because of the properties of the encapsulating composition of the present application directly applied to an organic electronic element, the present application may minimize physical and chemical damage to the element.

In an embodiment of the present application, the encapsulating composition may further comprise a surfactant. In one example, the surfactant may comprise a polar functional group, and the polar functional group may be present at the compound structural end of the surfactant. The polar functional group may include, for example, a carboxyl group, a hydroxyl group, a phosphate, an ammonium salt, a carboxylate group, a sulfate or a sulfonate. Furthermore, in an embodiment of the present application, the surfactant may be a non-silicone-based surfactant or a fluorine-based surfactant. The non-silicone-based surfactant or the fluorine-based surfactant may be applied together with the epoxy compound and the compound having an oxetane group as described above to provide excellent coating properties on the organic electronic element. On the other hand, in the case of a surfactant containing a polar reactive group, it may have high affinity with the other components of the encapsulating composition as described above, thereby realizing an excellent effect in terms of adhesion. In an embodiment of the present application, a hydrophilic fluorine-based surfactant or non-silicone-based surfactant may be used to improve inkjet coating properties on a base material.

Specifically, the surfactant may be a polymer type or oligomer type fluorine-based surfactant. As the surfactant, a commercially available product may be used, which may be selected from the group consisting of Glide 100, Glide 110, Glide 130, Glide 460, Glide 440, Glide 450 or RAD 2500 from TEGO, Megaface F-251, F-281, F-552, F554, F-560, F-561, F-562, F-563, F-565, F-568, F-570 and F-571 from DIC (DaiNippon Ink Chemicals), or Surflon S-111, S-112, S-113, S-121, S-131, S-132, S-141 and S-145 from Asahi Glass Co., Fluorad FC-93, FC-95, FC-98, FC-129, FC-135, FC-170C, FC-430 and FC-4430 from Sumitomo 3M Ltd., or Zonyl FS-300, FSN, FSN-100 and FSO from DuPont and BYK-350, BYK-354, BYK-355, BYK-356, BYK-358N, BYK-359, BYK-361N, BYK-381, BYK-388, BYK-392, BYK-394, BYK-399, BYK-3440, BYK-3441, BYKETOL-AQ, BYK-DYNWET 800 from BYK, and the like.

The surfactant may be included in an amount of 0.01 parts by weight to 10 parts by weight, 0.05 parts by weight to 10 parts by weight, 0.1 parts by weight to 10 parts by weight, 0.5 parts by weight to 8 parts by weight, or 1 part by weight to 4 parts by weight, relative to 100 parts by weight of the epoxy compound. Within the content range, the present application makes it possible that the encapsulating composition is applied to an inkjet method to form an organic layer of a thin film.

In an embodiment of the present application, the encapsulating composition may further comprise a photosensitizer in order to complement the curing property at a long wavelength activation energy beam of 300 nm or more. The photosensitizer may be a compound that absorbs a wavelength in a range of 200 nm to 400 nm, 250 nm to 400 nm, 300 nm to 400 nm or 350 nm to 395 nm.

The photosensitizer may be one or more selected from the group consisting of an anthracene-based compound such as anthracene, 9,10-dibutoxyanthracene, 9,10-dimethoxyanthracene, 9,10-diethoxyanthracene and 2-ethyl-9,10-dimethoxyanthracene; a benzophenone-based compound such as benzophenone, 4,4-bis(dimethylamino)benzophenone, 4,4-bis(diethylamino)benzophenone, 2,4,6-trimethylaminobenzophenone, methyl-o-benzolybenzoate, 3,3-dimethyl-4-methoxybenzophenone and 3,3,4,4-tetra(t-butylperoxycarbonyl)benzophenone; a ketone-based compound such as acetophenone, dimethoxyacetophenone, diethoxyacetophenone, 2-hydroxy-2-methyl-1-phenylpropan-1-one and propanone; perylene; a fluorene-based compound such as 9-fluorenone, 2-chloro-9-proprenone and 2-methyl-9-fluorenone; a thioxanthone-based compound such as thioxanthone, 2,4-diethylthioxanthone, 2-chlorothioxanthone, 1-chloro-4-propyloxythioxanthone, isopropylthioxanthone (ITX) and diisopropylthioxanthone; a xanthone-based compound such as xanthone and 2-methylxanthone; an anthraquinone-based compound such as anthraquinone, 2-methylanthraquinone, 2-ethylanthraquinone, t-butylanthraquinone and 2,6-dichloro-9,10-anthraquinone; an acridine-based compound such as 9-phenylacridine, 1,7-bis(9-acridinyl)heptane, 1,5-bis(9-acridinylpentane) and 1,3-bis(9-acridinyl)propane; a dicarbonyl compound such as benzyl, 1,7,7-trimethyl-bicyclo[2,2,1]heptane-2,3-dione and 9,10-phenanthrenequinone;

a phosphine oxide-based compound such as 2,4,6-trimethylbenzoyldiphenylphosphine oxide and bis(2,6-dimethoxybenzoyl)-2,4,4-trimethylpentylphosphine oxide; a benzoate-based compound such as methyl-4-(dimethylamino) benzoate, ethyl-4-(dimethylamino) benzoate and 2-n-butoxyethyl-4-(dimethyl amino) benzoate; an amino synergist such as 2,5-bis(4-diethylaminobenzal)cyclopentanone, 2,6-bis(4-diethylaminobenzal)cyclohexanone and 2,6-bis(4-diethylaminobenzal)-4-methyl-cyclopentanone; a coumarin-based compound such as 3,3-carbonylvinyl-7-(diethylamino)coumarin, 3-(2-benzothiazolyl)-7-(diethylamino)coumarin, 3-benzoyl-7-(diethylamino) coumarin, 3-benzoyl-7-methoxy-coumarin and 10,10-carbonylbis[1,1,7,7-tetramethyl-2,3,6,7-tetrahydro-1H,5H, 11H—Cl]-[6,7,8-ij]quinolizin-11-one; a chalcone compound such as 4-diethylaminochalcone and 4-azidobenzalacetophenone; 2-benzoylmethylene; and 3-methyl-b-naphthothiazoline.

The photosensitizer may be included in a range of 28 parts by weight to 40 parts by weight, 31 parts by weight to 38 parts by weight or 32 parts by weight to 36 parts by weight, relative to 100 parts by weight of the photoinitiator. By adjusting the content of the photosensitizer, the present application can prevent the photosensitizer from being dissolved in the inkjet coating to lower adhesive force, while implementing a curing sensitivity synergistic action at a desired wavelength.

The encapsulating composition of the present application may further comprise a coupling agent. The present application can improve adhesiveness of a cured product of the encapsulating composition to an adherend or moisture transmission resistance of the cured product. The coupling agent may include, for example, a titanium-based coupling agent, an aluminum-based coupling agent, or a silane coupling agent.

In an embodiment of the present application, the silane coupling agent may include, specifically, an epoxy-based silane coupling agent such as 3-glycidyloxypropyltrimethoxysilane, 3-glycidyloxypropyltriethoxysilane, 3-glycidyloxypropyl (dimethoxy)methylsilane and 2-(3,4-epoxycyclohexyl)ethyltrimethoxysilane; a mercapto-based silane coupling agent such as 3-mercaptopropyltrimethoxysilane, 3-mercaptopropyltriethoxysilane, 3-mercaptopropylmethyldimethoxysilane and 11-mercaptoundecyltrimethoxysilane; an amino-based silane coupling agent such as 3-aminopropyltrimethoxysilane, 3-aminopropyltriethoxysilane, 3-aminopropyldimethoxymethylsilane, N-phenyl-3-aminopropyltrimethoxysilane, N-methylaminopropyltrimethoxysilane, N-(2-aminoethyl)-3-aminopropyltrimethoxysilane and N-(2-aminoethyl)-3-aminopropyldimethoxymethylsilane; a ureide-based silane coupling agent such as 3-ureidepropyltriethoxysilane; a vinyl-based silane coupling agent such as vinyltrimethoxysilane, vinyltriethoxysilane and vinylmethyldiethoxysilane; a styryl-based silane coupling agent such as p-styryltrimethoxysilane; an acrylate-based silane coupling agent such as 3-acryloxypropyltrimethoxysilane and 3-methacryloxypropyltrimethoxysilane; an isocyanate-based silane coupling agent such as 3-isocyanatopropyltrimethoxysilane; a sulfide-based silane coupling agent such as bis(triethoxysilylpropyl)disulfide and bis(triethoxysilylpropyl)tetrasulfide; phenyltrimethoxysilane, methacryloxypropyl trimethoxysilane, imidazolesilane, triazinesilane, and the like.

In the present application, the coupling agent may be included in an amount of 0.1 parts by weight to 10 parts by weight or 0.5 parts by weight to 5 parts by weight, relative to 100 parts by weight of the epoxy compound. Within the above range, the present application can realize an effect of improving the adhesiveness by the addition of the coupling agent.

In one example, the encapsulating composition may further comprise an inorganic filler, if necessary. The specific type of the usable filler in the present application is not particularly limited, and for example, one or a mixture of two or more of clay, talc, alumina, calcium carbonate, silica, and the like may be used.

The encapsulating composition of the present application may comprise 0 parts by weight to 50 parts by weight, 1 part by weight to 40 parts by weight, 1 part by weight to 20 parts by weight, or 1 to 10 parts by weight of inorganic filler, relative to 100 parts by weight of the epoxy compound. The present application can provide a sealing structure having excellent moisture or humidity barrier properties and mechanical properties by controlling the inorganic filler, preferably, to 1 part by weight or more. Furthermore, by controlling the content of the inorganic filler to 50 parts by weight or less, the present invention can provide a cured product exhibiting excellent moisture barrier properties even when formed into a thin film.

In addition to the above-mentioned constitutions, the encapsulating composition according to the present application may comprise various additives in the range without affecting the above-described effects of invention. For example, the encapsulating composition may comprise a defoamer, a tackifier, an ultraviolet stabilizer or an antioxidant and the like in an appropriate range of content depending on the desired physical properties.

In one example, the encapsulating composition may be in a liquid phase at room temperature, for example, at 25° C. In an embodiment of the present application, the encapsulating composition may be in a solventless form liquid phase. The encapsulating composition may be applied to sealing an organic electronic element, and specifically, may be applied to sealing the entire surface of the organic electronic element. The encapsulating composition of the present application may have a specific composition and physical properties to be capable of ink-jetting.

Also, the encapsulating composition of the present application may be an ink composition. The encapsulating composition of the present application may be an ink composition capable of an inkjet process. The encapsulating composition of the present application may have a specific composition and physical properties so that ink-jetting can be performed.

Furthermore, in an embodiment of the present application, the encapsulating composition may have a viscosity in a range of 50 cPs or less, 1 to 46 cPs or 5 to 44 cPs, as measured by Brookfield's DV-3 at a temperature of 25° C., a torque of 90% and a shear rate of 100 rpm. By controlling the viscosity of the composition within the above range, the present application can realize physical properties that ink-jetting can be performed and increase coating properties, at the time of being applied to an organic electronic element, to provide a sealing material of a thin film.

In one example, the encapsulating composition may have a surface energy of the cured product after curing in a range of 5 mN/m to 45 mN/m, 10 mN/m to 40 mN/m, 15 mN/m to 35 mN/m, or 20 mN/m to 30 mN/m. The surface energy can be measured by a method known in the art, and for example, can be measured by a ring method. The present application can realize excellent coating properties in the above surface energy range.

In an embodiment of the present application, the surface energy ($\gamma^{surface}$ mN/m) can be calculated as $\gamma^{surface} = \gamma^{dispersion} + \gamma^{polar}$. In one example, the surface energy can be measured using a drop shape analyzer (DSA100 product from KRUSS). For example, after an encapsulating composition for measuring the surface energy is applied on a SiNx substrate to a thickness of about 50 μm and a coating area of 4 cm² (width: 2 cm, height: 2 cm) to form a sealing film (spin coater), it is dried at room temperature for about 10 minutes under a nitrogen atmosphere and then UV-cured with an intensity of 1000 mW/cm² through a light quantity of 4000 mJ/cm². The process of dropping the deionized water whose surface tension is known on the film after curing, and obtaining the contact angle thereof is repeated five times to obtain an average value of the obtained five contact angle values, and identically, the process of dropping the diiodomethane whose surface tension is known thereon and obtaining the contact angle thereof is repeated five times to obtain an average value of the obtained five contact angle values. Then, the surface energy can be obtained by substituting the value (Strom value) regarding the solvent surface tension by the Owens-Wendt-Rabel-Kaelble method using the obtained average values of the contact angles for the deionized water and diiodomethane.

In one example, the encapsulating composition of the present application may have an amount of the volatile organic compound measured after curing of less than 50 ppm. In this specification, the volatile organic compound can be expressed as outgas. The volatile organic compounds may be measured after curing the encapsulating composition and then holding a sample of the cured product at 110° C. for 30 minutes using Purge & Trap-gas chromatography/mass spectrometry. The measurement may be performed using a Purge & Trap sampler (JAI JTD-505 III)-GC/MS (Agilent 7890b/5977a) instrument.

The present application also relates to an organic electronic device. As shown in FIG. 1, an exemplary organic electronic device (3) may comprise a substrate (31); an organic electronic element (32) formed on the substrate (31); and an organic layer (33) sealing the entire surface of the organic electronic element (32) and containing the above-described encapsulating composition.

In an embodiment of the present application, the organic electronic element may comprise a first electrode layer, an organic layer formed on the first electrode layer and containing at least a light emitting layer, and a second electrode layer formed on the organic layer. The first electrode layer may be a transparent electrode layer or a reflective electrode layer, and the second electrode layer may also be a transparent electrode layer or a reflective electrode layer. More specifically, the organic electronic element may comprise a reflective electrode layer formed on a substrate, an organic layer formed on the reflective electrode layer and containing at least a light emitting layer, and a transparent electrode layer formed on the organic layer.

In the present application, the organic electronic element (32) may be an organic light emitting diode.

In one example, the organic electronic device according to the present application may be a top emission type, but is not limited thereto, and may be applied to a bottom emission type.

The organic electronic device may further comprise a protective layer (35) for protecting the electrodes and the light emitting layer of the element. The protective layer (35) may be an inorganic protective layer. The protective layer may be a protective layer by chemical vapor deposition (CVD), where the material may be the same as or different from the following inorganic layer and a known inorganic material may be used. For example, as the protective layer, silicon nitride (SiNx) may be used. In one example, silicon nitride (SiNx) used as the protective layer can be deposited to a thickness of 0.01 μm to 50 μm.

In an embodiment of the present application, the organic electronic device (3) may further comprise an inorganic layer (34) formed on the organic layer (33). The material of the inorganic layer (34) is not limited, which may be the same as or different from the above-described protective layer. In addition, the inorganic layer (34) may be formed in the same method as the protective layer (35). In one example, the inorganic layer may be one or more metal oxides or nitrides selected from the group consisting of Al, Zr, Ti, Hf, Ta, In, Sn, Zn and Si. The inorganic layer may have a thickness of 0.01 μm to 50 μm, 0.1 μm to 20 μm, or 1 μm to 10 μm. In one example, the inorganic layer of the present application may be an inorganic material without any dopant, or may be an inorganic material containing a dopant. The dopant which may be doped may be one or more elements selected from the group consisting of Ga, Si, Al, Sn, Ge, B, In, Tl, Sc, V, Cr, Mn, Fe, Co and Ni, or an oxide of the element, but is not limited thereto.

In one example, the organic layer may have a thickness in a range of 2 μm to 20 μm, 2.5 μm to 15 μm, or 2.8 μm to 9 μm. The present application may provide a thin-film organic electronic device by providing a thin organic layer.

The organic electronic device (3) of the present application may comprise a sealing structure containing the organic layer (33) and the inorganic layer (34), as described above, where the sealing structure may comprise at least one or more organic layers and at least one or more inorganic layers, and the organic layer and the inorganic layer may be repeatedly laminated. For example, the organic electronic device may have a structure of substrate/organic electronic element/protective layer/(organic layer/inorganic layer)n, where n may be a number in a range of 1 to 100. FIG. 1 is a cross-sectional view exemplarily showing a case where n is 1.

In one example, the organic electronic device (3) of the present application may further comprise a cover substrate present on the organic layer (33). The material of the substrate and/or the cover substrate is not particularly limited, and a known material in the art may be used. For example, the substrate or the cover substrate may be glass, a metal base material or a polymer film. As the polymer film, for example, a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acrylate copolymer film, an ethylene-methyl acrylate copolymer film or a polyimide film and the like may be used.

Also, as shown in FIG. 2, the organic electronic device (3) may further comprise a sealing film (37) existing between the cover substrate (38) and the substrate (31) on which the organic electronic element (32) is formed. The sealing film (37) may be applied as a use for attaching the substrate (31) on which the organic electronic element (32) is formed and the cover substrate (38), which may be, for example, a pressure-sensitive adhesive film or an adhesive film, but is not limited thereto. The sealing film (37) may seal the entire surface of the sealing structure (36) of the above-described organic layer and inorganic layer, laminated on the organic electronic element (32).

The present application also relates to a method for manufacturing an organic electronic device.

In one example, the manufacturing method may comprise a step of forming an organic layer (33) on a substrate (31) in which an organic electronic element (32) is formed on its upper part, so that the above-described encapsulating composition seals the entire surface of the organic electronic element (32).

Here, the organic electronic element (32) may be produced by forming a reflective electrode or a transparent electrode on a substrate (31) such as glass or a polymer film, as a substrate (31), by a method such as vacuum deposition or sputtering, and forming an organic material layer on the reflective electrode. The organic material layer may comprise a hole injecting layer, a hole transporting layer, a light emitting layer, an electron injecting layer, and/or an electron transporting layer. Subsequently, a second electrode is further formed on the organic material layer. The second electrode may be a transparent electrode or a reflective electrode.

The manufacturing method of the present application may further comprise a step of forming a protective layer (35) on the first electrode, the organic material layer and the second electrode, formed on the substrate (31). Then, the above-described organic layer (33) is applied to cover the entire surface of the organic electronic element (32) on the substrate (31). Here, the step of forming the organic layer (33) is not particularly limited and the above-described encapsulating composition may be applied to the top side of the substrate (31) using a process such as inkjet printing, gravure coating, spin coating, screen printing or reverse offset coating.

The manufacturing method may further comprise a step of irradiating the organic layer with light. In the present invention, a curing process may also be performed on an organic layer sealing an organic electronic device, and such a curing process may be performed, for example, in a heating chamber or a UV chamber, and preferably, may be performed in a UV chamber.

In one example, after the above-described encapsulating composition is applied to form a top side organic layer, the composition can be irradiated with light to induce crosslinking. The irradiation of light may comprise irradiating with light having a wavelength range of 250 nm to 450 nm or 300 nm to 450 nm region bands at a light quantity of 0.3 to 6 J/cm$^2$ or a light quantity of 0.5 to 5 J/cm$^2$.

In addition, the manufacturing method of the present application may further comprise a step of forming an inorganic layer (34) on the organic layer (33). As the step of forming an inorganic material layer, a known method in the art may be used, which may be the same as or different from the above-described method of forming a protective layer.

Advantageous Effects

The present application provides an encapsulating composition which can effectively block moisture or oxygen penetrating into an organic electronic device from the outside to secure the lifetime of the organic electronic device, can implement a top-emitting organic electronic device, can be applied in an inkjet method and can provide a sealing material having a thin thickness, and an organic electronic device comprising the same.

BRIEF DESCRIPTION OF DRAWINGS

FIGS. 1 and 2 illustrate cross-sectional views of an organic electronic device according to an exemplary embodiment of the present invention.

DESCRIPTION OF REFERENCE NUMERALS

3: organic electronic device
31: substrate
32: organic electronic element
33: organic layer
34: inorganic layer
35: protective layer
36: sealing structure
37: sealing film
38: cover substrate

BEST MODE

Hereinafter, the present disclosure will be described in more detail through Examples and Comparative Examples, but the scope of the present invention is not limited by the following examples.

Example 1

An alicyclic epoxy compound (Celloxide 2021P from Daicel) and an aliphatic epoxy compound (DE203, HAJIN CHEM TECH) as epoxy compounds, an oxetane group-containing compound (OXT-221 from TOAGOSEI), a photoinitiator (Irgacure PAG 290 from BASF, hereinafter, I290) and a fluorine-based surfactant (F552 from DIC) were each introduced into a mixing vessel at a weight ratio of 22.2: 18.8:49.0:5.0:1.0 (Celloxide2021P: DE203: OXT-221: I290: F552) at room temperature. CaO (Aldrich, average particle diameter of about 150 nm) was introduced thereto so that the amount of the moisture adsorbent was 15 parts by weight relative to 100 parts by weight of the epoxy compounds.

In the mixing vessel, a uniform encapsulating composition was prepared using a planetary mixer (Kurabo, KK-250s).

Example 2

An encapsulating composition was prepared in the same method as in Example 1, except that an alicyclic epoxy compound (Celloxide 2021P from Daicel) as an epoxy compound, an oxetane group-containing compound (OXT-221 from TOAGOSEI), a photoinitiator containing a sulfonium salt (I290) and a fluorine-based surfactant (F552 from DIC) were each introduced into a mixing vessel at a weight ratio of 37.5:52.5:5.0:1.0 (Celloxide2021P: OXT-221: I290: F552) at room temperature.

Example 3

An encapsulating composition was prepared in the same method as in Example 1, except that an alicyclic epoxy compound (Celloxide 2021P from Daicel) and an aliphatic epoxy compound (DE203, HAJIN CHEM TECH) as epoxy compounds, an oxetane group-containing compound (OXT-221 from TOAGOSEI), a photoinitiator (I290) and a fluorine-based surfactant (F552 from DIC) were each introduced into a mixing vessel at a weight ratio of 37.5:7.0:45.5:5.0:1.0 (Celloxide2021P: DE203: OXT-221: I290: F552) at room temperature.

Example 4

An encapsulating composition was prepared in the same method as in Example 1, except that Irgacure 250 (active contents 75 wt %, solvent (propylene carbonate) 25 wt %) from BASF as a iodonim photoinitiator was used instead of I290 as the photoinitiator.

Example 5

An encapsulating composition was prepared in the same method as in Example 1, except that an alicyclic epoxy compound (Celloxide 2021P from Daicel) and an aliphatic epoxy compound (DE203, HAJIN CHEM TECH) as epoxy compounds, an oxetane group-containing compound (OXT-221 from TOAGOSEI), a photoinitiator (Irgacure PAG 290 from BASF, hereinafter, I290), a fluorine-based surfactant (F552 from DIC) and diethylene glycol monobutyl ether acetate were each introduced into a mixing vessel at a weight ratio of 17.2:18.8:44.0:5.0:1.0:10.0 (Celloxide2021P: DE203: OXT-221: I290: F552: diethylene glycol monobutyl ether acetate) at room temperature.

Example 6

An encapsulating composition was prepared in the same method as in Example 1, except that an alicyclic epoxy compound (Celloxide 2021P from Daicel) and an aliphatic epoxy compound (DE203, HAJIN CHEM TECH) as epoxy compounds, an oxetane group-containing compound (OXT-221 from TOAGOSEI), a photoinitiator (Irgacure PAG 290 from BASF, hereinafter, I290) and a fluorine-based surfactant (F552 from DIC) were each introduced into a mixing vessel at a weight ratio of 5:26:48:5:1 (Celloxide2021P: DE203: OXT-221: I290: F552) at room temperature.

Comparative Example 1

An encapsulating composition was prepared in the same method as in Example 1, except that an alicyclic epoxy compound (Celloxide 2021P from Daicel) and an aliphatic epoxy compound (DE203, HAJIN CHEM TECH) as epoxy compounds, an oxetane group-containing compound (OXT-221 from TOAGOSEI), a photoinitiator (Irgacure PAG 290 from BASF, hereinafter, I290) and a fluorine-based surfactant (F552 from DIC) were each introduced into a mixing vessel at a weight ratio of 2.3:23.4:64.3:5.0:1.0 (Celloxide2021P: DE203: OXT-221: I290: F552) at room temperature.

Comparative Example 2

An encapsulating composition was prepared in the same method as in Example 1, except that an alicyclic epoxy compound (Celloxide 2021P from Daicel) and an aliphatic epoxy compound (DE203, HAJIN CHEM TECH) as epoxy compounds, an oxetane group-containing compound (OXT-221 from TOAGOSEI), a photoinitiator (Irgacure PAG 290 from BASF, hereinafter, I290) and a fluorine-based surfactant (F552 from DIC) were each introduced into a mixing vessel at a weight ratio of 10:10:59:5:1 (Celloxide2021P: DE203: OXT-221: I290: F552) at room temperature.

Comparative Example 3

An encapsulating composition was prepared in the same method as in Example 1, except that an alicyclic epoxy compound (Celloxide 2021P from Daicel) as an epoxy compound, an oxetane group-containing compound (3-allyloxy oxetane from TCI), tri(ethylene glycol) divinyl ether (TEGDVE), a photoinitiator (Irgacure PAG 290 from BASF, hereinafter, I290) and a fluorine-based surfactant (F552 from DIC) were each introduced into a mixing vessel at a weight ratio of 20:50:30:5:1 (Celloxide2021P: 3-allyloxy oxetane: TEGDVE: I290: F552) at room temperature.

Physical properties in Examples and Comparative Examples were evaluated in the following manner.

1. SiNx Deposited Film Experiment

On a glass base material on which a SiNx deposited film was formed, the encapsulating compositions prepared in Examples and Comparative Examples were each inkjet-coated to form an organic layer having a thickness of 5 μm.

The sample was observed under constant temperature and humidity conditions of 85° C. and 85% RH for a lifting phenomenon of the deposited film. It was classified as X when the lifting occurred 50% or more relative to the total area by observation for 1000 hours, as Δ when the lifting occurred less than 50% relative to the total area and as O when no lifting occurred at all.

2. Determination of Discharge Possibility and Ink-Jetting Suitability

Ink-jetting was attempted using Unijet UJ-200 (Inkjet head-Dimatix 10Pl 256) for the encapsulating compositions prepared in Examples and Comparative Examples. Discharge tests were performed at intervals of 5 minutes, and it was classified as O when dischargeable duration was 3 hours or more, as A when it was 1 hour or more and less than 3 hours and as X when it was less than 1 hour.

TABLE 1

| | SiNx deposited film experiment | Determination of discharge possibility and ink-jetting suitability |
|---|---|---|
| Example 1 | O | O |
| Example 2 | O | Δ |
| Example 3 | O | Δ |
| Example 4 | Δ | O |
| Example 5 | Δ | O |
| Example 6 | Δ | O |
| Comparative Example 1 | X | O |
| Comparative Example 2 | X | O |
| Comparative Example 3 | X | X |

The invention claimed is:

1. An encapsulating composition, comprising an epoxy compound, a compound having an oxetane group included in an amount of 68 to 145 parts by weight relative to 100 parts by weight of the epoxy compound, and a moisture adsorbent having an average particle diameter of 98 nm to 495 nm,
   wherein the epoxy compound comprises a compound having a cyclic structure in its molecular structure and a linear or branched aliphatic compound, and
   wherein the linear or branched aliphatic compound is included in an amount of 80 parts by weight or more and less than 205 parts by weight relative to 100 parts by weight of the compound having a cyclic structure.

2. The encapsulating composition according to claim 1, wherein at least one of the compound having a cyclic structure in its molecular structure and the linear or branched aliphatic compound is at least bifunctional.

3. The encapsulating composition according to claim 1, wherein the compound having an oxetane group has a boiling point in a range of 90 to 300° C.

4. The encapsulating composition according to claim 1, wherein the compound having an oxetane group has a weight average molecular weight in a range of 150 to 1,000 g/mol.

5. The encapsulating composition according to claim 1, further comprising an ionic photoinitiator.

6. The encapsulating composition according to claim 5, wherein the ionic photoinitiator is a photoinitiator comprising a sulfonium salt.

7. The encapsulating composition according to claim 5, wherein the photoinitiator is included in an amount of 1 to 15 parts by weight relative to 100 parts by weight of the epoxy compound.

8. The encapsulating composition according to claim 1, further comprising a surfactant.

9. The encapsulating composition according to claim 8, wherein the surfactant comprises a polar functional group.

10. The encapsulating composition according to claim 8, wherein the surfactant comprises a fluorine-based compound.

11. The encapsulating composition according to claim 8, wherein the surfactant is included in an amount of 0.01 parts by weight to 10 parts by weight relative to 100 parts by weight of the epoxy compound.

12. The encapsulating composition according to claim 1, which is a solventless ink composition.

13. The encapsulating composition according to claim 1, having a viscosity of 50 cPs or less as measured by Brookfield's DV-3 at a temperature of 25° C., a torque of 90% and a shear rate of 100 rpm.

14. The encapsulating composition according to claim 1, wherein the moisture adsorbent is a chemically reactive adsorbent.

15. The encapsulating composition according to claim 1, wherein the moisture adsorbent is included in an amount of 5 to 150 parts by weight relative to 100 parts by weight of the epoxy compound.

16. An organic electronic device comprising a substrate; an organic electronic element formed on the substrate; and an organic layer sealing the entire surface of the organic electronic element and containing the encapsulating composition according to claim 1.

17. A method for manufacturing an organic electronic device comprising a step of forming an organic layer containing the encapsulating composition according to claim 1 on a substrate having an organic electronic element formed thereon, such that the encapsulating composition seals the entire surface of the organic electronic element.

18. The method for manufacturing an organic electronic device according to claim 17, wherein the step of forming the organic layer comprises inkjet printing, gravure coating, spin coating, screen printing or reverse offset coating.

* * * * *